United States Patent [19]

Kouzuma et al.

[11] Patent Number: 5,215,598
[45] Date of Patent: * Jun. 1, 1993

[54] FLEXIBLE PHOTOVOLTAIC DEVICE AND MANUFACTURING METHOD THEREOF

[75] Inventors: Shinichi Kouzuma, Hirakata; Hiroshi Inoue; Kenji Murata, both of Osaka; Hiroyuki Tanaka, Moriguchi; Yasuo Kishi, Hirakata, all of Japan

[73] Assignee: Sanyo Electric Co., Ltd., Moriguchi, Japan

[ * ] Notice: The portion of the term of this patent subsequent to Dec. 3, 2008 has been disclaimed.

[21] Appl. No.: 745,182

[22] Filed: Aug. 15, 1991

Related U.S. Application Data

[63] Continuation-in-part of Ser. No. 578,088, Sep. 5, 1990, Pat. No. 5,069,727.

[30] Foreign Application Priority Data

Sep. 6, 1989 [JP] Japan .................................. 1-104660
Sep. 18, 1989 [JP] Japan .................................. 1-242768
Sep. 27, 1989 [JP] Japan .................................. 1-252665

[51] Int. Cl.⁵ ..................... H01L 31/048; H01L 31/18
[52] U.S. Cl. ............................ 136/251; 136/259; 437/2; 437/4
[58] Field of Search ............... 136/244, 245, 251, 259; 437/2-5, 180, 209

[56] References Cited

U.S. PATENT DOCUMENTS

5,069,927 12/1991 Kouzuma et al. .................. 136/251

FOREIGN PATENT DOCUMENTS

1-105581 4/1989 Japan ...................................... 437/4

Primary Examiner—Aaron Weisstuch
Attorney, Agent, or Firm—W. G. Fasse

[57] ABSTRACT

A flexible photovoltaic device comprises a first, insulating and flexible resin layer; a first electrode formed on the first resin layer; a flexible resin type locking member formed having satisfactory adherence and formed along the inner periphery of the transparent electrode; a semiconductor layer formed to cover the first electrode and the locking member for photoelectric conversion; a second electrode formed on the semiconductor layer; and a second insulating and flexible resin layer formed on the second electrode.

23 Claims, 11 Drawing Sheets

5,215,598

FLEXIBLE PHOTOVOLTAIC DEVICE AND MANUFACTURING METHOD THEREOF

CROSS REFERENCE TO RELATED APPLICATION

The present application is a continuation-in-part application of U.S. Ser. No. 07/578,088, filed Sep. 5, 1990, which resulted in U.S. Pat. No. 5,069,727 and issued on Dec. 3, 1991.

FIELD OF THE INVENTION

The present invention relates to a flexible photovoltaic device and to an improvement in the manufacturing method therefor.

BACKGROUND INFORMATION

A flexible photovoltaic device and the manufacturing method thereof is described in Japanese Patent Laying-Open No. 1-105581, for example.

Referring to FIG. 1, a first resin layer 2 of polyimide resin with a superior heat resistance, is formed on a supporting substrate 1 such as of glass. The first resin layer 2 is transparent and insulating, as well as flexible. A transparent electrode 3, a thin film semiconductor layer 4 for photoelectric conversion, and a back metal electrode 5 are layered in sequence on the first resin layer 2. Semiconductor layer 4 comprises a p-i-n junction, a p-n junction or the like parallel to the film face. A second resin layer 14 such as of an ethylene vinyl acetate copolymer (EVA) sheet, is layered on the back of electrode 5. The second resin layer 14 is insulating and flexible.

Referring to FIG. 2, the photovoltaic device formed on the supporting substrate 1 is immersed in water 16 of in a container 15, for separating the device from the supporting substrate 1. This results in a flexible photovoltaic device shown in FIG. 3.

In the flexible photovoltaic device formed in the aforementioned manner, the second resin layer 14 is provided to protect the back metal electrode 5 against the water 16. The second resin layer 14 is formed so as to have a shrinking force substantially equal to that of the first resin layer 2, to prevent the flexible photovoltaic device from curling after being separated from the supporting substrate 1.

Incidentally, the flexible photovoltaic device may also be formed by stacking the component layers 2, 3, 4, 5, and 14 in inverse order on the supporting substrate 1 and then separating the inversely stacked layers from the supporting substrate 1.

In the flexible photovoltaic device obtained in the above manner, however, the layers having a weak bond with each other in the multilayered structure, i.e. the transparent electrode 3 (or the back electrode 5) and the semiconductor layer 4, are apt to be separated from each other at the edge of the photovoltaic device, due to mechanical stress such as bending or torsion exerted on the device. If the transparent electrode 3 or the back electrode 5 and the semiconductor layer 4 are locally separated, the photoelectric conversion efficiency will be reduced significantly.

It is preferred that the first resin layer 2 has a low adhesion to the substrate 1 when the flexible photovoltaic device is separated from the supporting substrate 1. However, the first resin layer 2 must have a sufficient adhesion to the substrate 1 until the second resin layer 14 is formed. It generally takes a long time of two to three days, for water 16 to permeate into the interface of the supporting substrate 1 and the first resin layer 2 to cause a natural separation therebetween.

If an additional external force is applied to separate the photovoltaic device from the supporting substrate 1 in a short period, high stress will be generated in the region A surrounded by a broken line in FIG. 2, whereby the transparent electrode 3 and the semiconductor layer 4 are separated from each other locally whereby the photoelectric conversion efficiency degraded significantly.

Furthermore, because the first resin layer 2 of the polyimide resin and the second resin layer 14 of EVA sheet have a moisture permeability, local separation may be seen in the semiconductor layer 4 of the layered structure if the photovoltaic device is kept in an environment of a high humidity for a long time.

SUMMARY OF THE INVENTION

In view of the foregoing, it is an object of the present invention to provide a flexible photovoltaic device having a mechanically stable layered structure.

Another object of the present invention is to provide a flexible photovoltaic device that can be formed in a relatively short time and a method of manufacturing thereof.

A further object of the present invention is to provide a flexible photovoltaic device having a moisture resistance and a method of manufacturing thereof.

In accordance with one aspect of the present invention, a flexible photovoltaic device comprises a first insulating and flexible resin layer; a first electrode formed on the first resin layer; a locking member of flexible resin having a satisfactory adherence along the inner periphery of the first electrode; a semiconductor layer formed to cover the first electrode and the locking member for a photoelectric conversion; a second electrode formed on the semiconductor layer; and a second insulating and flexible resin layer formed on the second electrode.

In accordance with another aspect of the present invention, the method of manufacturing a flexible photovoltaic device comprises the steps of forming a releasing agent layer on a region of a main surface of a supporting substrate excluding the inner peripheral margin of the main surface thereof; forming a first insulating and flexible resin layer so as to cover the margin and the releasing agent layer; forming a first electrode, a semiconductor layer for photoelectric conversion, and a second electrode in sequence on the first resin layer; forming a second insulating and flexible resin layer on the second electrode; creating a cut in the layered structure from the second resin layer to the first resin layer along the inner periphery of the releasing agent layer; and peeling off the layered structure, cut island-like, from the releasing agent layer in a relatively short time.

In accordance with a further aspect of the present invention, a flexible photovoltaic device comprises a first insulating and flexible resin layer; a first electrode formed on one side of the first resin layer; a semiconductor layer formed on the first electrode for photoelectric conversion; a second electrode formed on the semiconductor layer; a second insulating and flexible resin layer having a shrinking force, formed on the second electrode; a third flexible resin layer having a shrinking force, formed on the other side of the first resin layer; wherein the bending moment in the photovoltaic device caused by the shrinking force of the second resin layer is canceled by the bending moment of the shrinking force of the third resin layer.

In accordance with a still further aspect of the present invention, a method of manufacturing a flexible photovoltaic device comprises the steps of forming a first insulating and flexible resin layer on a supporting substrate; forming a first electrode, a semiconductor layer for photoelectric conversion, and a second electrode in sequence on the first resin layer; forming a second insulating and flexible resin layer having a shrinking force, on the second electrode; separating the first resin layer from the supporting substrate in a relatively short time by using the shrinking force of the second resin layer; forming a third flexible resin layer having a shrinking force, on the free surface of the first resin layer; whereby the bending moment in the photovoltaic device caused by the shrinking force of the second resin layer is canceled by the bending moment caused by the shrinking force of the third resin layer.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

The first embodiment of the present invention will be described with reference to FIGS. 4-10.

Figure 1:
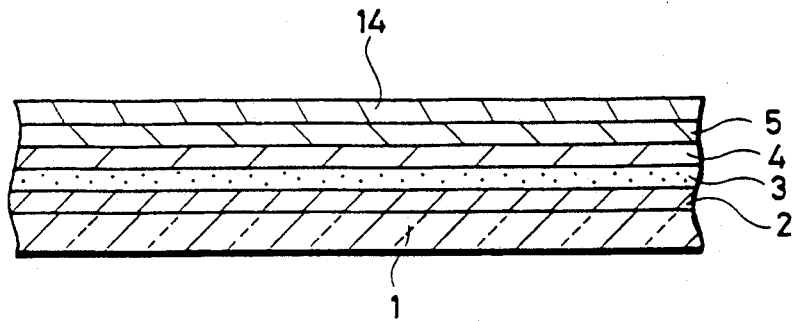
FIGS. 1-3 are sectional views showing the manufacturing steps of a flexible photovoltaic device by of prior art.
Figure 2:
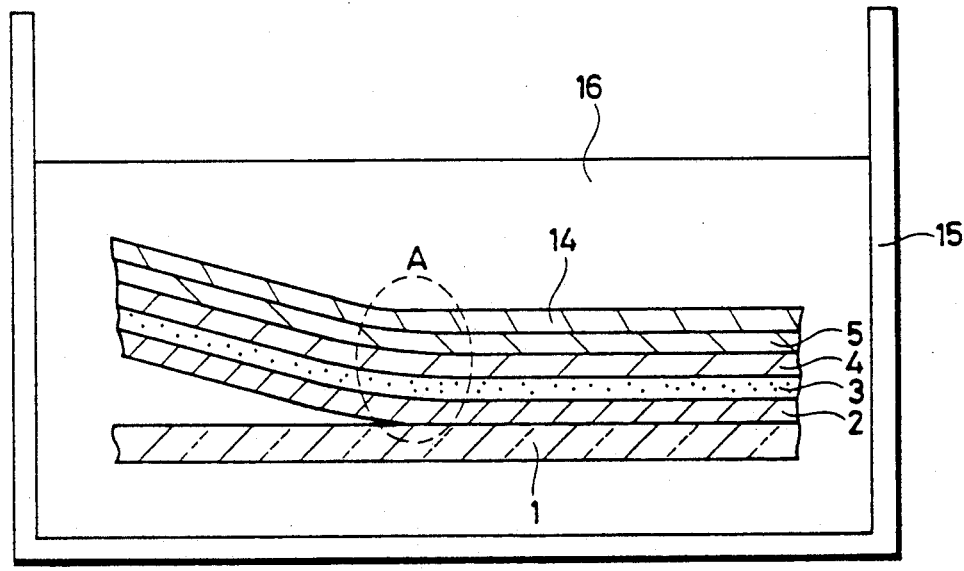
Figure 3:
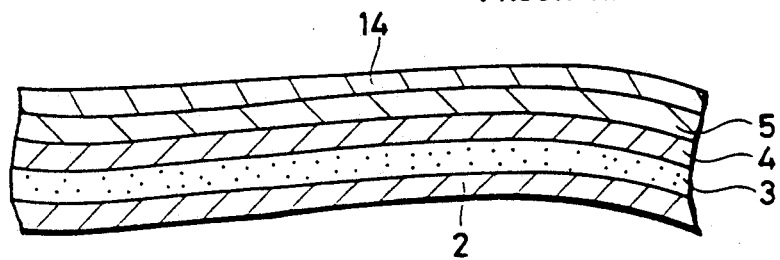
Figure 4:
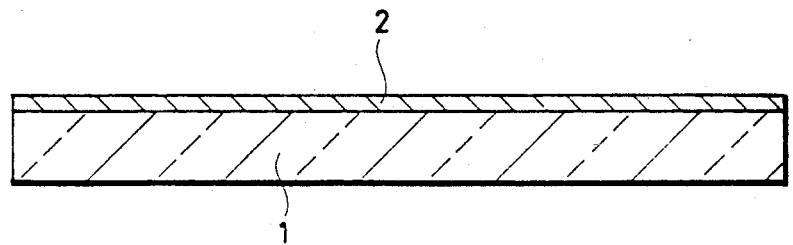
FIGS. 4-9 are sectional views showing the manufacturing steps of a flexible photovoltaic device in accordance with the first embodiment of the present invention.

Referring to FIG. 4, a first transparent, insulating and flexible resin layer 2 of organic polymer film is formed on the supporting substrate 1 constituted by glass, ceramic, metal, or the like. A transparent polyimide varnish, for example, is applied uniformly by a spin coater or a roll coater, and the temperature of the same is raised from 100° C. to 300° C. stepwise, to form the first resin layer 2. It is preferred that the first resin layer 2 has a thickness of not less than 5 $\mu$m from the standpoint of mechanical strength, and a thickness of not more than 100 $\mu$m from the standpoint of transparency.

Figure 5:
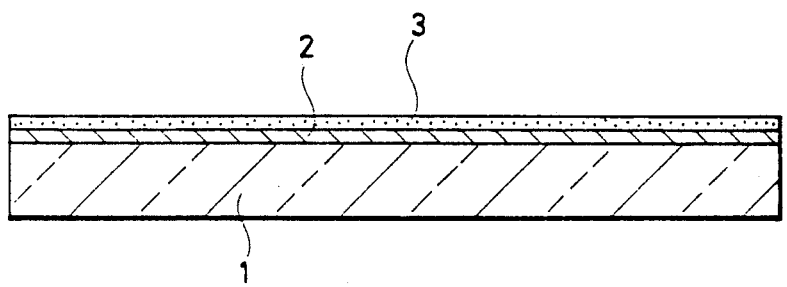

Referring to FIG. 5, a transparent electrode 3 constituted by tin oxide ($SnO_2$) or indium tin oxide (ITO) and the like is formed on the first resin layer 2 to a thickness of 2000-5000 Å.

Figure 6:
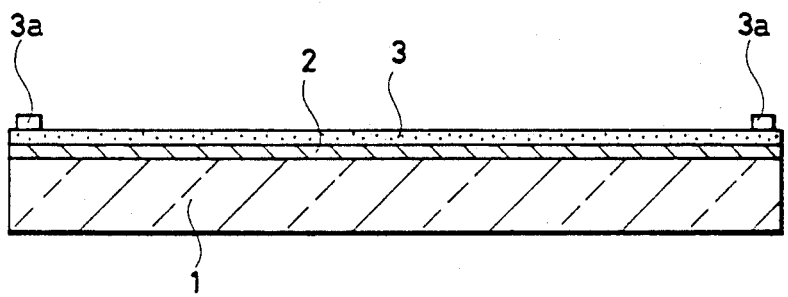
Figure 10:
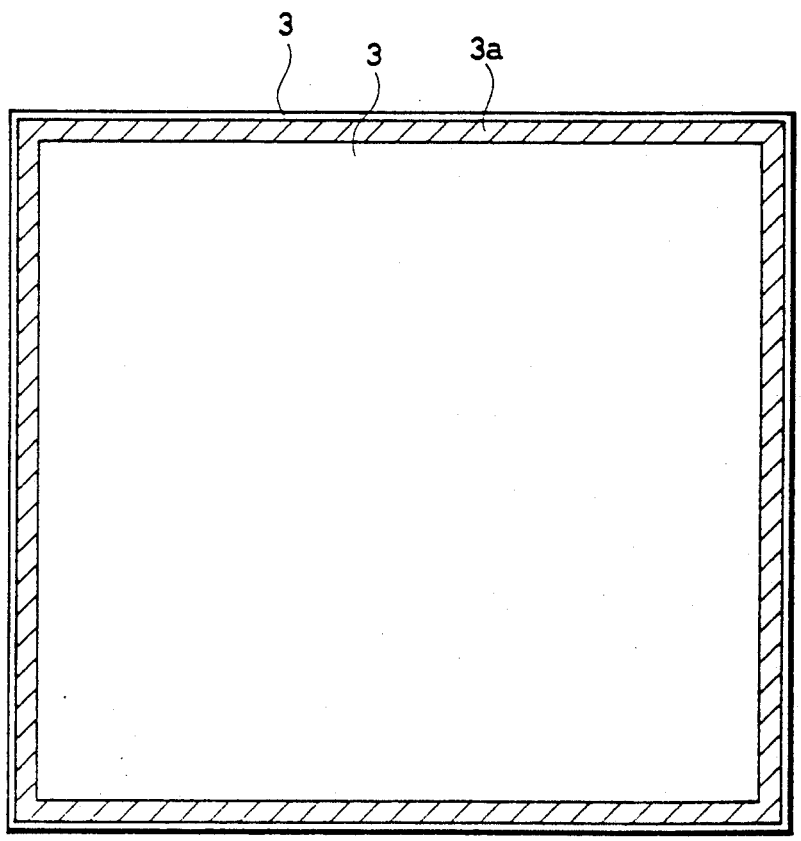
FIG. 10 is a top plan view corresponding to FIG. 6.

Referring to the sectional view of FIG. 6 and the top plan view of FIG. 10, a flexible locking member 3a is formed on the transparent electrode layer 3 along the inner periphery. This locking member 3a is provided for the purpose of securing the periphery of the semiconductor layer to be laminated to the transparent electrode 3. The locking member 3a may be formed by applying a paste, for example, of a polyimide type resin onto the transparent electrode 3 by screen process printing with a pattern of 100-150 $\mu$m in width and 10-20 $\mu$m in height, and baking the pattern of the paste for approximately 30 minutes at a temperature of approximately 250° C.

Figure 7:
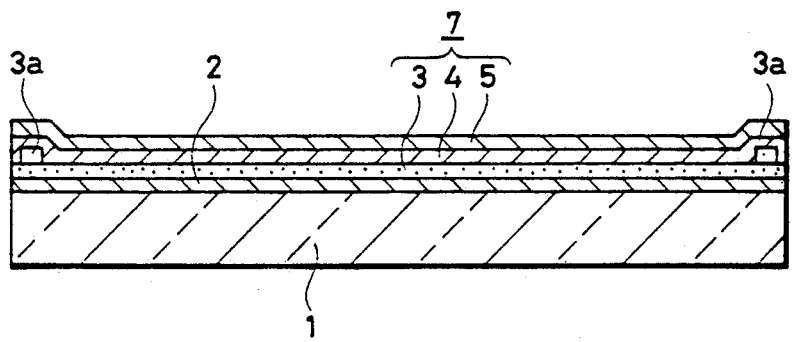

Referring to FIG. 7, the transparent electrode 3 and the locking member 3a are covered by the semiconductor layer 4 for photoelectric conversion. The semiconductor layer 4 has a thickness of approximately 3000-7000 Å, comprising a semiconductor junction such as a p-i-n junction or p-n junction parallel to the film face. As the semiconductor layer 4, a layer comprising amorphous silicon (a-Si), amorphous silicon carbide (a-SiC), or amorphous silicon germanium (A-SiGe) and the like may be formed by a plasma CVD method or a photo-assisted CVD method. A metal back electrode 5 having a thickness of approximately 4000 Å-2 $\mu$m is formed on the semiconductor layer 4. The back electrode 5 may comprise a single layer structure of aluminum (Al), a double layer structure of Al and titanium (Ti), a double layer structure of Al and titanium silver alloy (TiAg), or other multilayer structures. Thus, a photoelectric conversion element 7 is formed comprising the transparent electrode 3, the semiconductor layer 4, and the back electrode 5.

Figure 8:
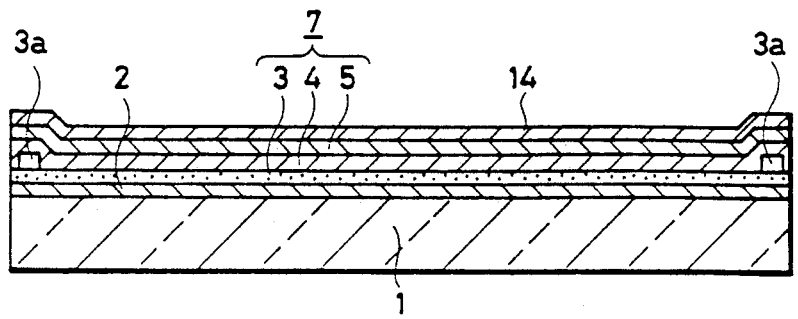

Referring to FIG. 8, a second flexible and insulating resin layer 14 is formed on the back electrode 5 to a thickness of approximately 0.1-1.0 mm. The second resin layer 14 may be formed by arranging a thermoplastic resin sheet such as of EVA on the back electrode, and heating it to 100°-150° C., followed by exerting a pressure of 0.1-10 kg/cm² for thermal bonding.

Figure 9:
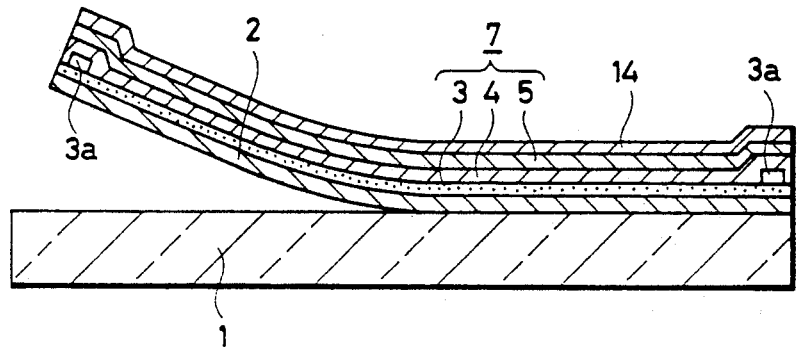

Referring to FIG. 9, the photovoltaic device supported on substrate 1, is immersed in water to separate the first resin layer 2 from the substrate 1. This separation results in a flexible photovoltaic device having the photoelectric conversion element 7 sandwiched between the first resin layer 2 and the second resin layer 14. In this flexible photovoltaic device, the peeling of the semiconductor layer 4 from the periphery of the transparent electrode 3 can be prevented even when the device is subjected to bending stress or torsion stress because the periphery of the semiconductor layer 4 is firmly fixed to the transparent electrode 3 by the locking member 3a.

Although a flexible photovoltaic device having only a single photoelectric conversion element 7 included between the first resin layer 2 and the second resin layer 14, has been described in the above mentioned first embodiment, a plurality of photoelectric conversion elements 7 connected electrically in series or in parallel may be included between the first resin layer 2 and the second resin layer 14.

The second embodiment of the present invention will be described with reference to FIGS. 11-14.

Figure 11:
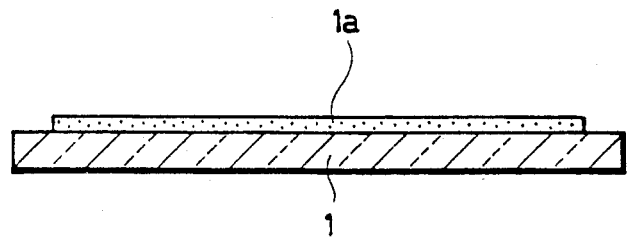
FIGS. 11-13 are sectional views showing the manufacturing steps of a flexible photovoltaic device in accordance with the second embodiment of the present invention.

Referring to FIG. 11, a releasing agent layer 1a of silicone resin is applied onto the main surface of the supporting substrate 1 such as glass, within a region slightly smaller than the main surface thereof. The releasing agent layer 1a is applied by screen process printing, for example, to a thickness of 5-20 μm, with a margin of 1-5 mm in width at the periphery of the main surface of the supporting substrate 1. The applied releasing agent layer 1a is baked at a temperature of 250° C.-300° C.

Figure 12:
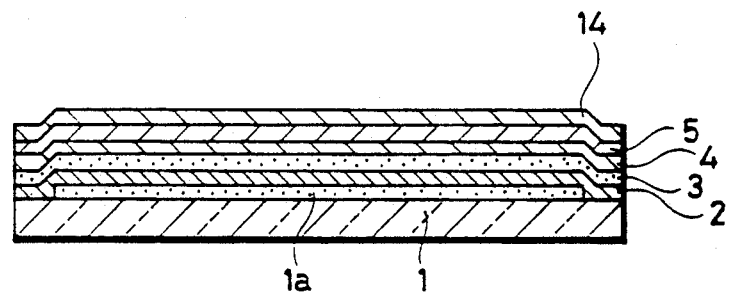

Referring to FIG. 12, the main surfaces of the releasing agent layer 1a and the supporting substrate 1 are covered by the first resin layer 2 such as of polyimide. Similarly to the first embodiment, a transparent electrode 3, a semiconductor layer 4, and a metal back electrode 5 are layered in sequence on the first resin layer 2. A second resin layer 14 of a thermoplastic resin sheet such as EVA is formed on the back electrode 5 to a thickness of approximately 20 μm-1 mm. Thus, a photovoltaic device supported on the substrate 1, is completed.

Figure 13:
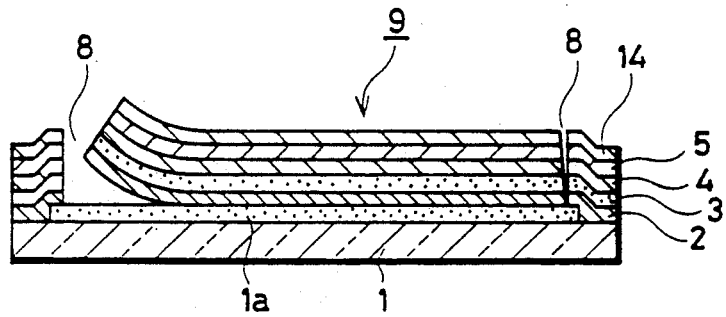
Figure 14:
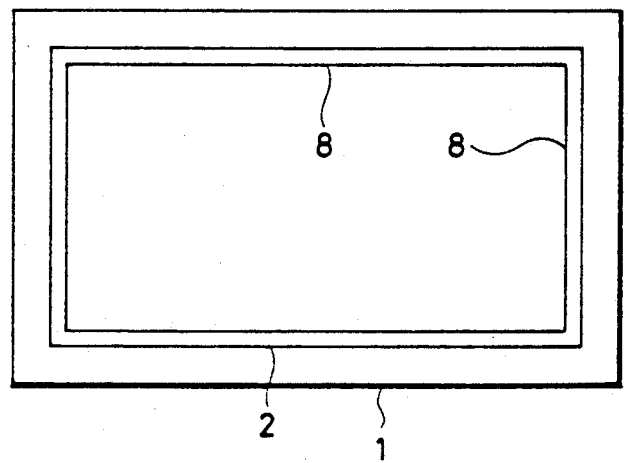
FIG. 14 is a top plan view corresponding to FIG. 13.

Referring to the sectional view of FIG. 13 and the top plan view of FIG. 14, the photovoltaic device is cut, island-like, using a laser beam, for example, along the inner periphery of the releasing agent layer 1a. The photovoltaic device cut, island-like, is located only above the releasing agent layer 1a, to be easily separated from the releasing agent layer for obtaining a flexible photovoltaic device 9. The flexible photovoltaic device 9 can be easily separated from the supporting substrate 1 in a short period without the substrate being immersed in water. During the formation process of the photovoltaic device, the first resin layer 2 is firmly fixed to the margin of the main surface of the substrate 1 remaining along the outer periphery of the releasing agent layer 1a, until the second resin layer 14 is formed.

The third embodiment of the present invention is described with reference to FIGS. 15-19.

Figure 15:
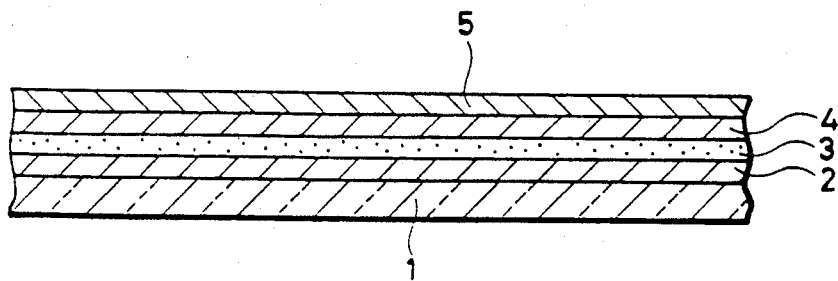
FIGS. 15-19 are sectional views showing the manufacturing steps of a flexible photovoltaic device in accordance with the third embodiment of the present invention.

Referring to FIG. 15, a first resin layer 2, a transparent electrode 3, a semiconductor layer 4, and a metal back electrode 5 are layered in sequence on the supporting substrate 1, similar to the first embodiment.

Figure 16:
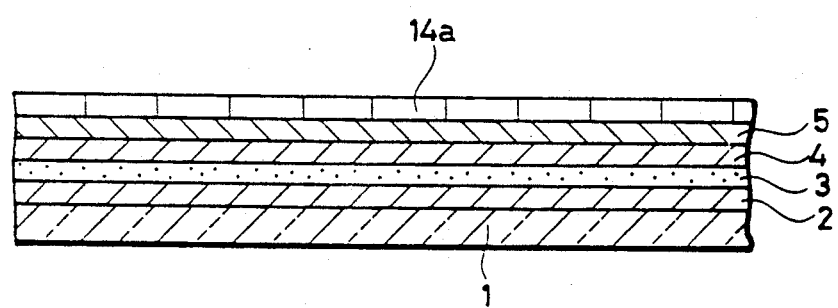

Referring to FIG. 16, a second resin layer 14a having a high shrinking force is formed to a thickness of approximately 20 μm-1 mm on the back electrode 5. The shrinking force of the second resin layer 14a is greater than that of the first resin layer 2 so that the side of the second resin layer curls in a concave manner. The second resin layer 14a can be formed by applying a thermosetting varnish of polyimide type or an acrylic type, for example, onto the back electrode 5 uniformly using a spinner, a roll coater, a spray or the like, followed by a rise in temperature to 100° C.-200° C. The second resin layer 14a may alternatively be formed by layering a thermoplastic resin sheet such as EVA of approximately 20 μm-100 μm in thickness, and a moisture-proof film such as polyethylene telephthalate (PET) or fluorine-containing resin of approximately 20 μm-1 mm in thickness in sequence, whereby the double layer film is heated to a temperature of 100° C.-150° C. and a pressure of 0.1-10 kg/cm$^2$ is applied thereto for thermal bonding. The second resin layer 14a formed in the above manner generates a shrinking force when cooled down to room temperature from the raised temperature.

Figure 17:
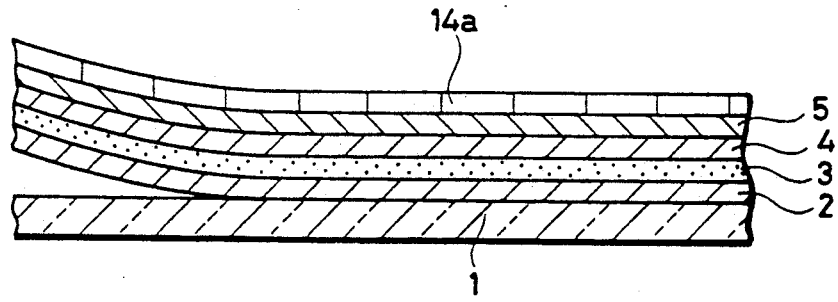

Referring to FIG. 17, the photovoltaic device formed on the supporting substrate 1 is immersed in water to separate the first resin layer 2 from the supporting substrate 1. Because the shrinking force of the second resin layer 14a which is greater than that of the first resin layer 2, acts so as to curl the second resin layer side of the photovoltaic device of the multilayered structure in a concave manner, the first resin layer 2 is separated from the substrate 1 in a relatively short time of 30 minutes to 10 hours.

Figure 18:
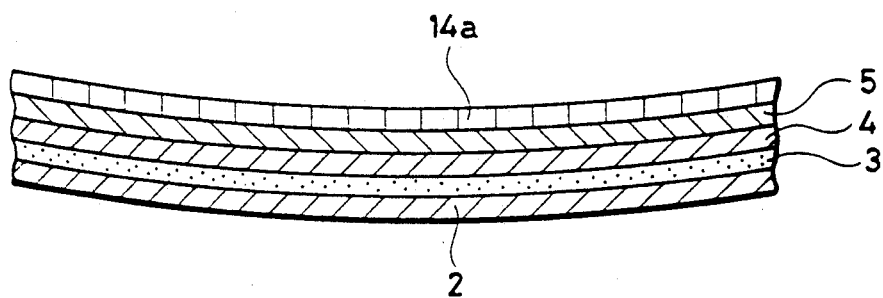

Referring to FIG. 18, the flexible photovoltaic device separated from the supporting substrate 1, has the second resin layer side curled in a concave manner due to the shrinking force of the second resin layer 14a. The second resin layer 14a generates a great shrinking force in proportion to the thickness thereof. Although it is possible to separate the photovoltaic device from the supporting substrate 1 in a shorter period, if the shrinking force of the second resin layer 14a is great, the radius of curvature of the curl of the photovoltaic device will become smaller after the separation. The transparent electrode 3 and the semiconductor layer 4 are susceptible to local separation if the radius of curvature of the curl becomes too small. Therefore, it is preferred that the second resin layer 14a has a shrinking force which generates a radius of curvature of the curl of approximately 2 cm-10 cm.

Figure 19:
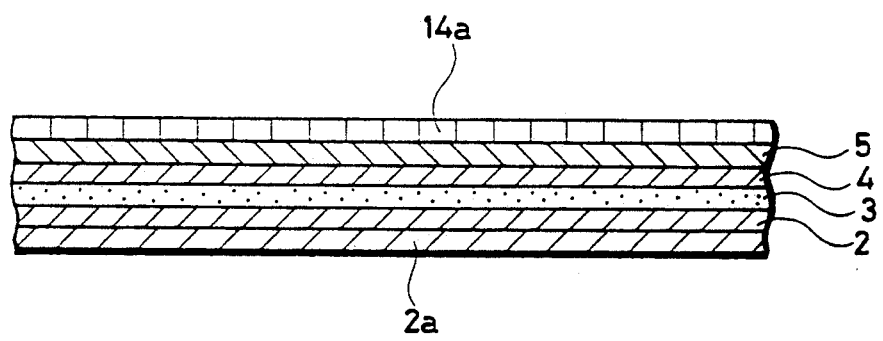
Figure 20:
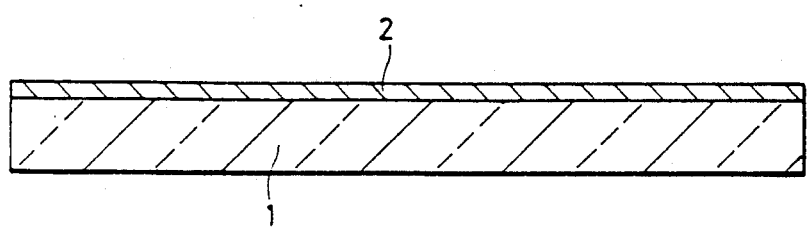
FIGS. 20-25 are sectional views showing the manufacturing steps of a flexible photovoltaic device in accordance with the forth embodiment of the present invention.
Figure 21:
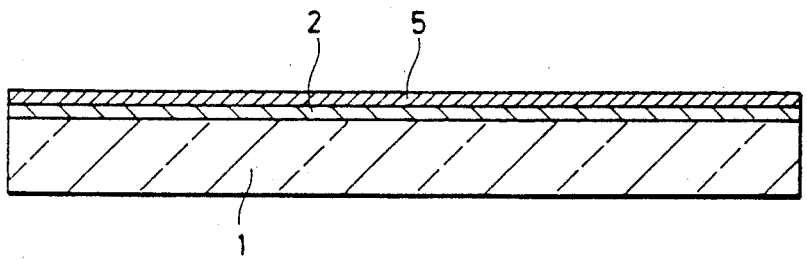
Figure 22:
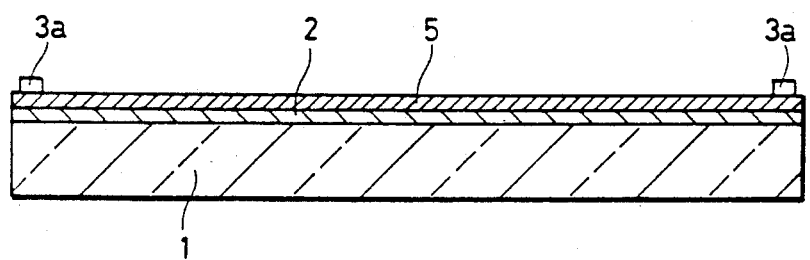
Figure 23:
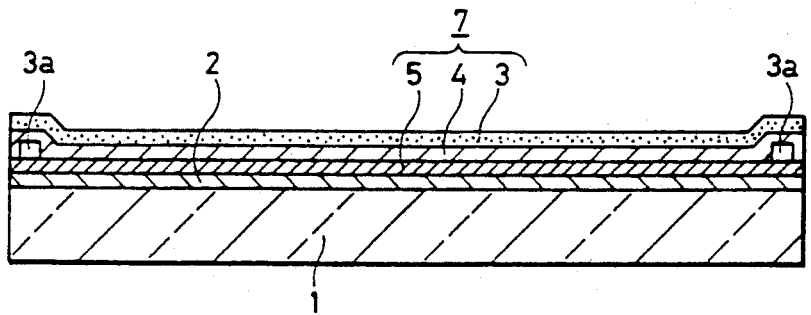
Figure 24:
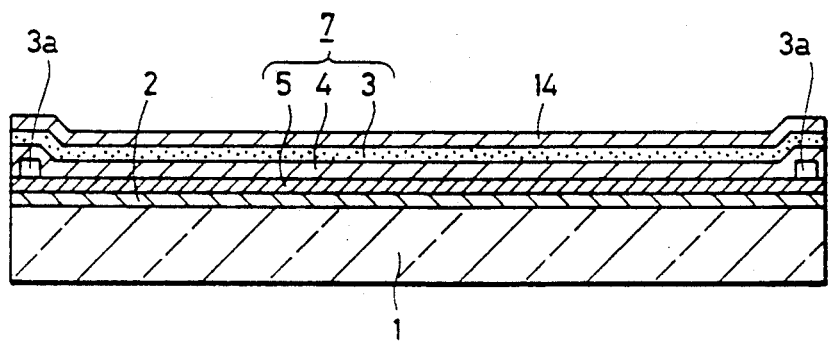
Figure 25:
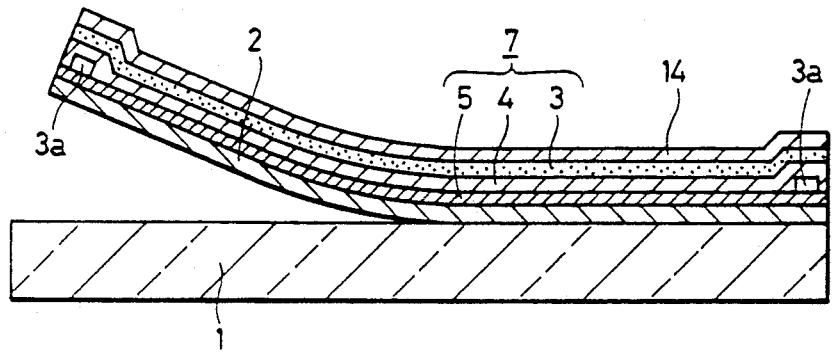
Figure 26:
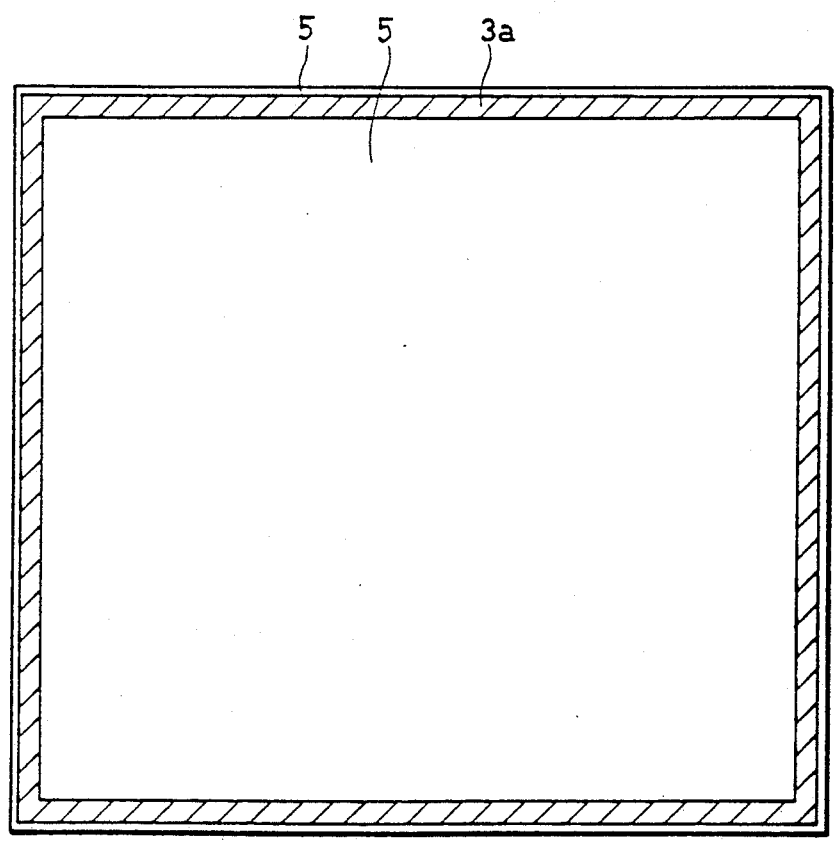
FIG. 26 is a top plan view corresponding to FIG. 22.
Figure 27:
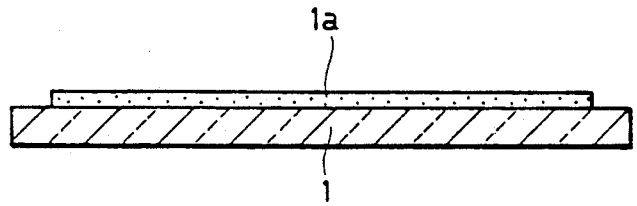
FIGS. 27-29 are sectional views showing the manufacturing steps of a flexible photovoltaic device in accordance with the fifth embodiment of the present invention.
Figure 28:
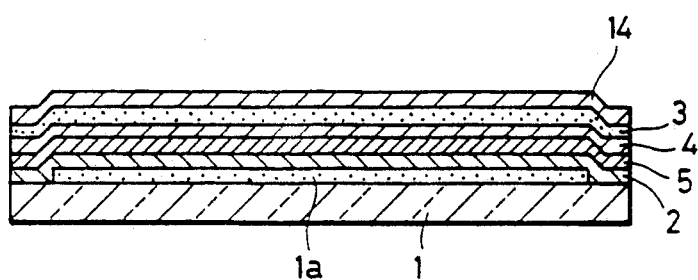
Figure 29:
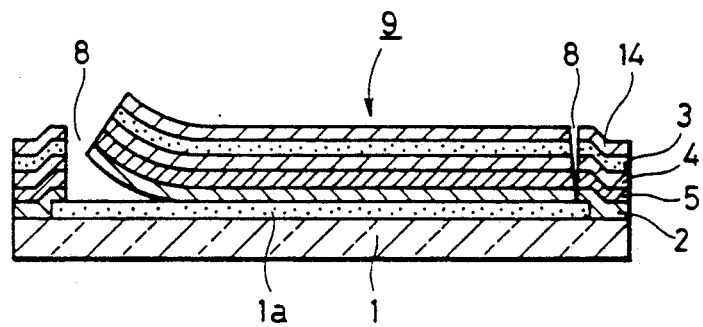
Figure 30:
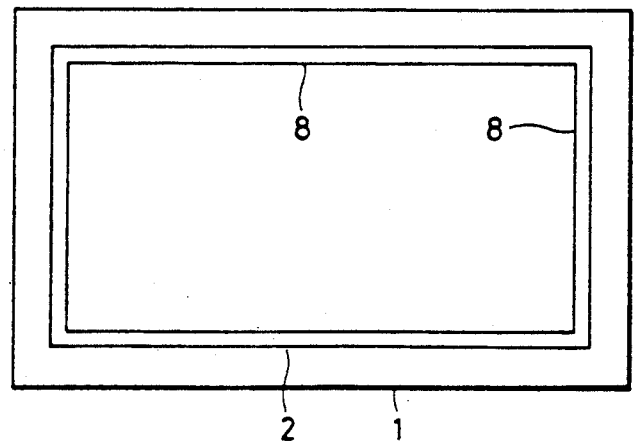
FIG. 30 is a top plan view corresponding to FIG. 29.
Figure 31:
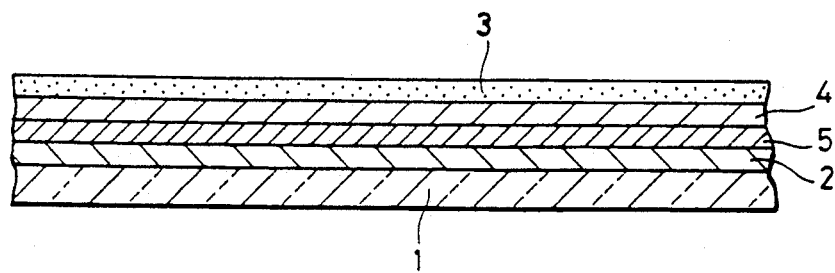
FIGS. 31-35 are sectional views showing the manufacturing steps of a flexible photovoltaic device accordance with the sixth embodiment of the present invention.
Figure 32:
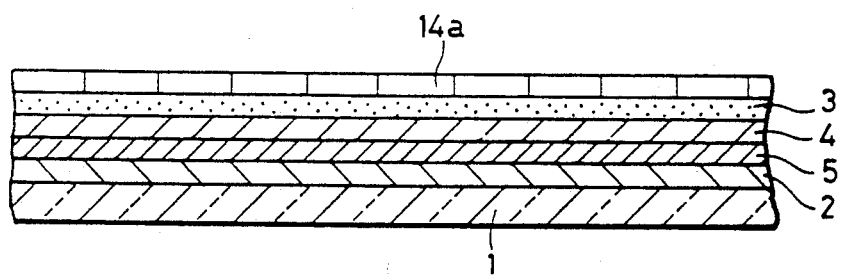
Figure 33:
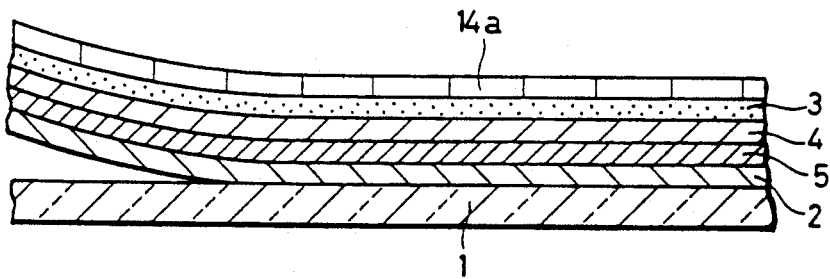
Figure 34:
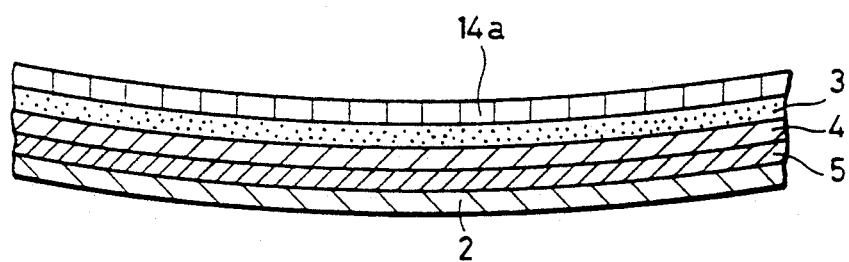
Figure 35:
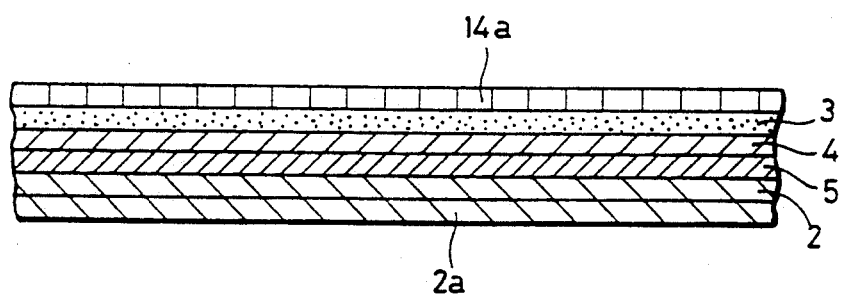

Referring to FIG. 19, a third transparent and flexible resin layer 2a having shrinking force, is formed on the free surface of the first resin layer 2. A thermo-setting varnish of a polyimide type or an acrylic type, for example, is applied uniformly onto the free surface of the first resin layer 2 using a roll coater, a spray, or the like, and heated to a temperature of 100° C.-200° C., to form the third resin layer 2a having a thickness of approximately 20 μm-1 mm. The third resin layer 2a may alternatively be formed by layering a thermoplastic resin sheet such as of EVA of approximately 20 μm-100 μm in thickness and a film superior in moisture-proofness such as of PET or fluorine-containing resin of approximately 20 μm-1 mm in thickness, on the free surface of the first resin layer 2 in sequence, whereby the double layer film is heated to 100° C.-150° C. and a pressure of 0.1-10 kg/cm$^2$ is applied thereto for thermal bonding.

The bending moment caused by the shrinking force of the third resin layer 2a cancels the bending moment caused by the shrinking force of the second resin layer 14a, to straighten and flatten the curl of the flexible photovoltaic device.

In the case where the second resin layer 14a and the third resin layer 2a comprise a moisture-proof PET film or a fluorine-containing resin film, the undesired effect of moisture on the transparent electrode 3, on the semiconductor layer 4, and on the metal back electrode 5 is prevented thereby obtaining a flexible photovoltaic device of high reliability.

The fourth embodiment of the present invention illustrated in FIGS. 20-26 is similar to the first embodiment illustrated in FIGS. 4-10, except that the component layers 3, 4 and 5 are stacked inversely as compared to the first embodiment. In the fourth embodiment, the first resin layer 2 need not be transparent, but the second resin layer 14 must be transparent.

The fifth embodiment of the present invention illustrated in FIGS. 27-30 is similar to the second embodiment illustrated in FIGS. 11-14, except that the component layers 3, 4 and 5 are stacked inversely as compared to the second embodiment. In the fifth embodiment, the first resin layer 2 need not be transparent, but the second resin layer 14 must be transparent.

The sixth embodiment of the present invention illustrated in FIGS. 31-35 is similar to the third embodiment illustrated in FIGS. 15-19, except that the component layers 3, 4 and 5 are stacked inversely as compared to the third embodiment. In the sixth embodiment, the first and third resin layers 2 and 2a need not be transparent, but the second resin layer 14a must be transparent.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A flexible photovoltaic device comprising:
   a first insulating and flexible resin layer,
   a first electrode formed on said first resin layer,
   a flexible resin type locking member having an adherence formed along the inner periphery of said first electrode,
   a semiconductor layer formed so as to cover said first electrode and said locking member for photoelectric conversion,
   a second electrode formed on said semiconductor layer, and
   a second insulating and flexible resin layer formed on said second electrode.

2. The flexible photovoltaic device according to claim 1, wherein said second electrode and said second resin layer are transparent.

3. The flexible photovoltaic device according to claim 1, wherein said locking member is formed of a polyimide type resin.

4. The flexible photovoltaic device according to claim 1, wherein said first resin layer is formed of polyimide type resin.

5. The flexible photovoltaic device according to claim 4, wherein the first resin layer is formed to a thickness of 5-100 μm.

6. The flexible photovoltaic device according to claim 1, wherein said second resin layer is formed of a thermoplastic resin sheet.

7. The flexible photovoltaic device according to claim 6, wherein said thermoplastic resin comprises a member selected from the group consisting of EVA, PET, and fluorine-containing resin.

8. A method of manufacturing a flexible photovoltaic device comprising the steps of:
   forming a releasing agent layer on a main surface of a supporting substrate, excluding the inner peripheral margin of the main surface thereof,
   forming a first insulating and flexible resin layer so as to cover said margin and said releasing agent layer,
   forming a first electrode, a semiconductor layer for photoelectric conversion, and a second electrode on said first resin layer in sequence,
   forming a second insulating and flexible resin layer on said second electrode,
   creating a cut in the multilayer structure from said second resin layer to said first resin layer along the inner periphery of said releasing agent layer, and
   peeling said multilayer structure, cut island-like, from said releasing agent layer.

9. The method according to claim 8, wherein said second electrode and said second resin layer are transparent.

10. The method according to claim 8, wherein said cut is created in the multilayer structure from said second resin layer to said first resin layer by a laser beam.

11. The method according to claim 8, wherein said releasing agent layer is formed using silicone resin.

12. The method according to claim 11, wherein said silicone resin is applied to a thickness of 5-20 μm by screen process printing, followed by baking at a temperature within the range of 250° C.-300° C.

13. A method according to claim 8, wherein said margin has a width of 1-5 mm.

14. A flexible photovoltaic device comprising:
   a first insulating and flexible resin layer,
   a first electrode formed on one side of said first resin layer,
   a semiconductor layer formed on said first electrode for photoelectric conversion,
   a second electrode formed on said semiconductor layer,
   a second insulating and flexible resin layer having shrinking force formed on said second electrode, and
   a third flexible resin layer having shrinking force formed on the other side of said first resin layer,
   wherein the bending moment within said photovoltaic device caused by the shrinking force of said second resin layer is canceled by the bending moment caused by the shrinking force of said third resin layer.

15. The flexible photovoltaic device according to claim 14, wherein said second electrode and said second resin layer are transparent.

16. The flexible photovoltaic device according to claim 14, wherein each of said second and third resin layers is formed by a member selected from the group consisting of thermosetting resin of polyimide type and acrylic type.

17. The flexible voltaic device according to claim 14, wherein each of said second and third resin layers is formed by a member selected from the group consisting of a double layer of EVA and PET, and a double layer of EVA and resin of fluorine-containing type, whereby said photovoltaic device is protected from moisture.

18. A method of manufacturing a flexible photovoltaic device, comprising the steps of:
   forming a first, insulating and flexible resin layer on a supporting substrate,
   forming a first electrode, a semiconductor layer for photoelectric conversion, and a second electrode on said first resin layer in sequence,
   forming a second insulating and flexible resin layer having a shrinking force, on said second electrode,
   separating said first resin layer from said supporting substrate in a relatively short time by using the shrinking force of said second resin layer, and
   forming a third flexible resin layer having a shrinking force, on the free surface of said first resin layer,
   wherein the bending moment in said photovoltaic device caused by the shrinking force of said second resin layer is canceled by the bending moment caused by the shrinking force of the third resin layer.

19. The method according to claim 18, wherein said second electrode and said second resin layer are transparent.

20. The method according to claim 18, wherein said first resin layer is separated from said supporting substrate in water.

21. The method according to claim 18, wherein each of said second and third resin layers is formed by applying a member selected from the group consisting of thermosetting varnish of polyimide type and acrylic type, and being heating said device.

22. The method according to claim 18, wherein each of said second and third resin layers is formed by layering sheets of EVA and PET, and applying a predetermined pressure for thermal bonding.

23. The method according to claim 18, wherein each of said second and third resin layers is formed by layering sheets of EVA and fluorine-containing type resin and applying a predetermined pressure for thermal bonding.

* * * * *

UNITED STATES PATENT AND TRADEMARK OFFICE
CERTIFICATE OF CORRECTION

PATENT NO.   : 5,215,598
DATED        : June 1, 1993
INVENTOR(S)  : Shinichi Kouzuma et al.

It is certified that error appears in the above-identified patent and that said Letters Patent is hereby corrected as shown below:

Column 9, line 10, delete "being"

Signed and Sealed this

Nineteenth Day of April, 1994

Attest:

BRUCE LEHMAN

Attesting Officer

Commissioner of Patents and Trademarks